US012588473B2

(12) United States Patent
King et al.

(10) Patent No.: US 12,588,473 B2
(45) Date of Patent: Mar. 24, 2026

(54) DEVICE, SYSTEM AND METHOD FOR VOLTAGE GENERATING

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Ya-Chin King, Taipei (TW); Chrong Jung Lin, Hsinchu (TW); Burn Jeng Lin, Hsinchu (TW); Wei Chang, New Taipei (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 361 days.

(21) Appl. No.: 18/322,046

(22) Filed: May 23, 2023

(65) Prior Publication Data

US 2024/0395641 A1     Nov. 28, 2024

(51) Int. Cl.
    *H01L 21/66*       (2006.01)
    *G05F 1/10*        (2006.01)
(52) U.S. Cl.
    CPC .............. *H01L 22/34* (2013.01); *H01L 22/14* (2013.01); *G05F 1/10* (2013.01)
(58) Field of Classification Search
    CPC ................ H10H 29/142; H10H 20/819; H01L 21/6831–6833; H01L 22/10–14; H01L 22/30–34
    See application file for complete search history.

(56) References Cited

U.S. PATENT DOCUMENTS

| | | | |
|---|---|---|---|
| 2010/0144063 A1* | 6/2010 | Furumiya .......... | G01R 31/3025 |
| | | | 257/E21.531 |
| 2010/0248398 A1* | 9/2010 | Wang .................. | H01L 21/6831 |
| | | | 156/345.24 |
| 2020/0051877 A1* | 2/2020 | Seddon ................... | H01L 22/12 |

(Continued)

OTHER PUBLICATIONS

Kuball et al., "High-pressure high-temperature annealing of ion-implanted GaN films monitored by visible and ultraviolet micro-Raman scattering", Journal of Applied Physics, vol. 87, No. 6, Mar. 15, 2000, pp. 2736-2741 (total 7 pages).

(Continued)

*Primary Examiner* — Fernando L Toledo
*Assistant Examiner* — Marshall Mu-Nuo Hatfield
(74) *Attorney, Agent, or Firm* — Birch, Stewart, Kolasch & Birch, LLP

(57) ABSTRACT

A device in a chamber is provided. The device comprises at least one die. The at least one die comprise a first voltage generator, a dielectric layer and a first voltage regulator circuit. The first voltage generator is charged to have a first induced voltage by induced charges generated in response to a first voltage of a first electrode of a chuck in the chamber. The dielectric layer surrounds the first voltage generator to isolate the first voltage generator from the first electrode. The first voltage regulator circuit is coupled to the first voltage generator to receive the first induced voltage and generates a first power supply voltage according to the first induced voltage for a first circuit in the device.

20 Claims, 24 Drawing Sheets

900

(56)                    References Cited

U.S. PATENT DOCUMENTS

2021/0246071 A1*    8/2021   Minemura  ............. H01L 23/13
2023/0005723 A1*    1/2023   Kim  ................. H01L 21/67069

OTHER PUBLICATIONS

Lee et al., "A Monolithic Current-Mode CMOS DC-DC Converter
With On-Chip Current-Sensing Technique", IEEE Journal of Solid-
State Circuits, vol. 39, No. 1, Jan. 2004, pp. 3-14.
Wang et al., "A Low-noise Low-Dropout Regulator Using a 28-nm
Technology", IEEE, 2020, total 5 pages.

* cited by examiner

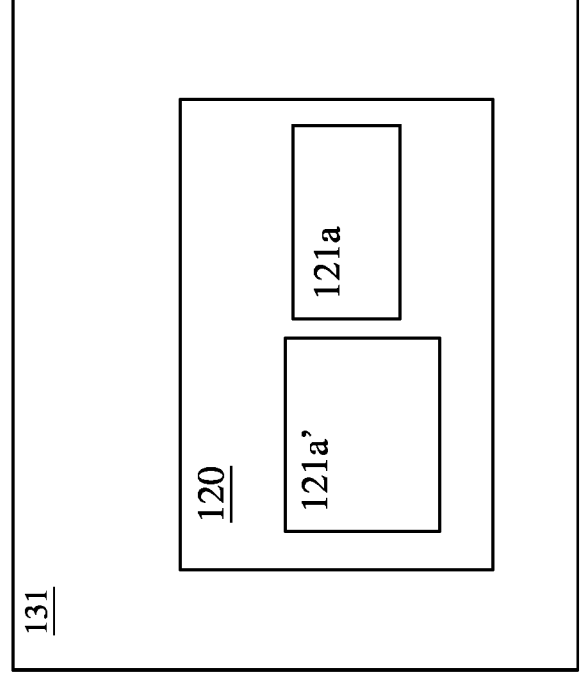
300
FIG. 8
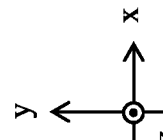

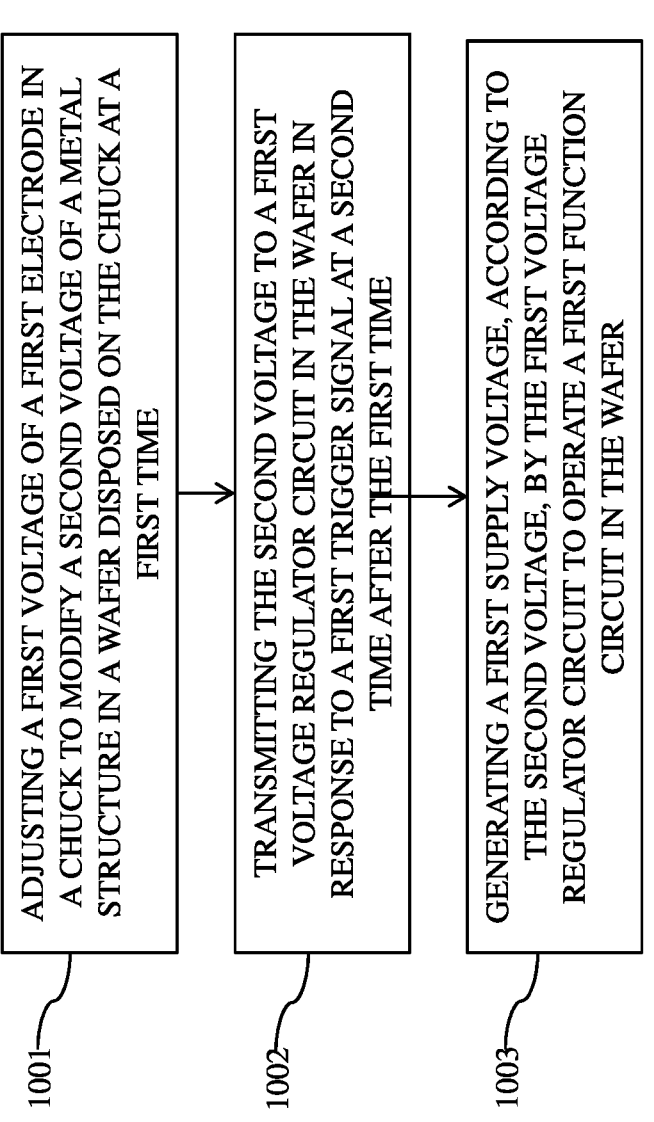

1000

1001 — ADJUSTING A FIRST VOLTAGE OF A FIRST ELECTRODE IN A CHUCK TO MODIFY A SECOND VOLTAGE OF A METAL STRUCTURE IN A WAFER DISPOSED ON THE CHUCK AT A FIRST TIME

1002 — TRANSMITTING THE SECOND VOLTAGE TO A FIRST VOLTAGE REGULATOR CIRCUIT IN THE WAFER IN RESPONSE TO A FIRST TRIGGER SIGNAL AT A SECOND TIME AFTER THE FIRST TIME

1003 — GENERATING A FIRST SUPPLY VOLTAGE, ACCORDING TO THE SECOND VOLTAGE, BY THE FIRST VOLTAGE REGULATOR CIRCUIT TO OPERATE A FIRST FUNCTION CIRCUIT IN THE WAFER

FIG. 24

DEVICE, SYSTEM AND METHOD FOR VOLTAGE GENERATING

BACKGROUND

Process control for semiconductor manufacturing is a procedure used to maintain a proper operating condition for a process. For process control, a sensing module extracting the on-wafer parameters is required to detect an out-of-control situation. Once the out-of-control situation is detected, the process condition would be adjusted to minimize the process variability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a schematic diagram illustrating parts of a system in a layout view, in accordance with some embodiments.

FIG. 24 is a flow chart of a method of operating a system, in accordance with some embodiments.

DETAILED DESCRIPTION

Figure 1:
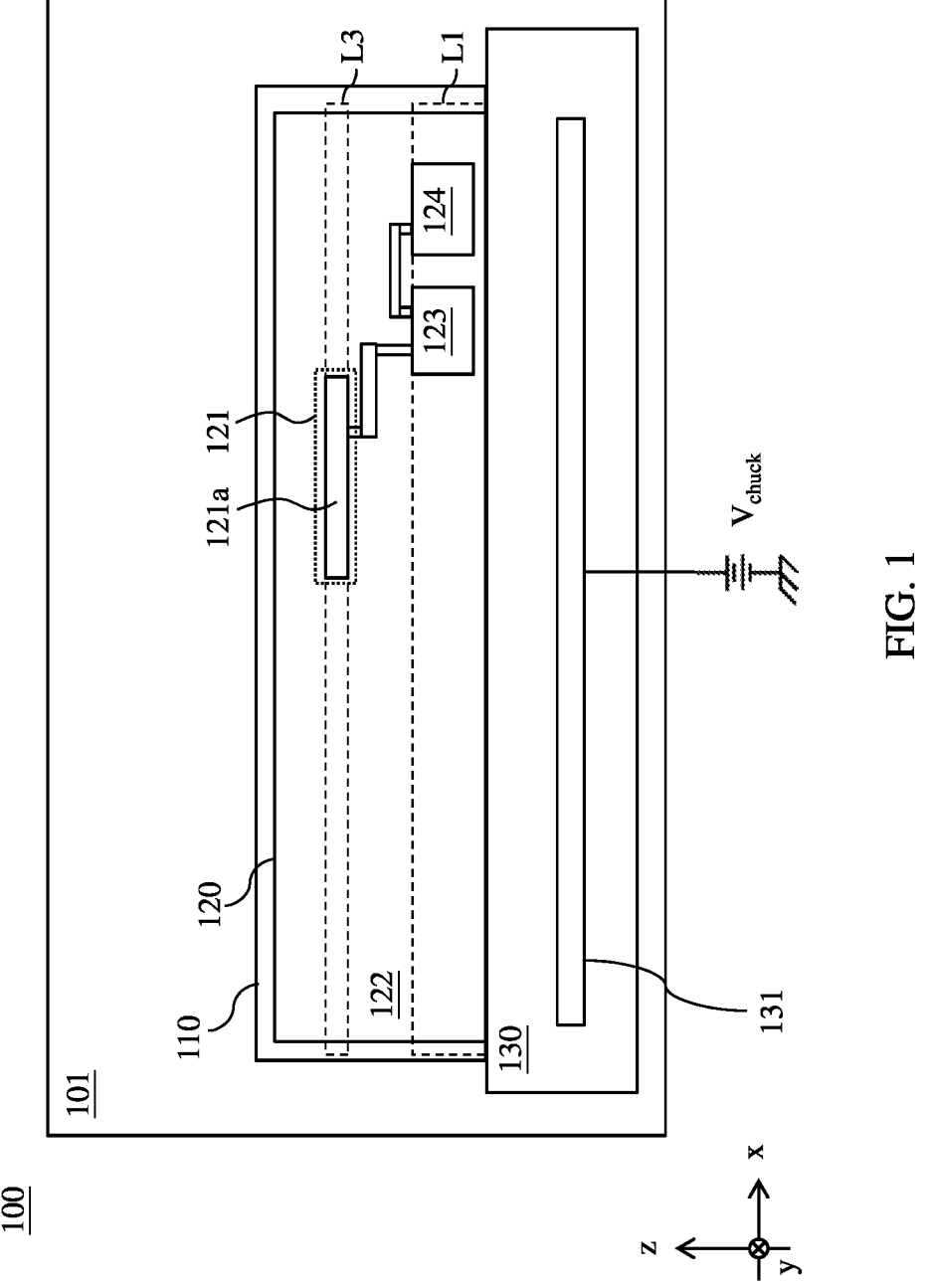
FIG. 1 is a schematic diagram illustrating a system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a system 100, in accordance with various embodiments. For illustration, the system 100 includes a chamber 101, a device 110 and a chuck 130. In some embodiments, the device 110 is placed in the chamber 101 during a process (e.g., an extreme ultraviolet lithography (EUV), ion implantation, and other wafer manufacturing process) to the device 110. According to various embodiments, the device 110 is a semiconductor wafer. The chuck 130 is disposed in the chamber 101 and is configured to hold the device 110 (e.g., by fixing the device 110 on the top of the chuck 130) in the chamber 101 during the process. In some embodiments, the chuck 130 includes an electrode 131. The electrode 131 includes a metal structure formed as a metal sheet on the xy plane according to some embodiments. The electrode 131 is configured to receive a voltage $V_{chuck}$ to generate an electrostatic force between the chuck 130 and the device 110 to fix the device 110 on the chuck 130.

As shown in FIG. 1, according to various embodiments, the device 110 includes at least a die 120. The die 120 includes a voltage generator 121, a dielectric layer 122, a voltage regulator circuit 123 and a function circuit 124. The voltage generator 121 is surrounded by the dielectric layer 122 and is isolated from the chuck 130 by the dielectric layer 122. In some embodiments, the dielectric layer 122 includes dielectric materials, for example, Fluorosilicate glass (FSG) or other suitable dielectric materials.

For illustration, the voltage generator 121 is disposed in a semiconductor layer L3 of the device 110 and arranged above the electrode 131. The voltage generator 121 includes a metal structure 121a. In some embodiments, the metal structure 121a and the electrode 131 overlap with each other in a layout view. As shown in the embodiments of FIG. 1, the metal structure 121a at least extends in x direction in a shape of a metal line. In various embodiments, the metal structure 121a is in a shape of a metal sheet disposed in the semiconductor layer L3. In some embodiments, the metal structure 121a is an input/output (I/O) pad of the device 110. In some embodiments, the semiconductor layer L3 includes a metal layer in the device 110 (e.g., a wafer).

The voltage regulator circuit 123 and the function circuit 124 are disposed in a semiconductor layer L1 below the semiconductor layer L3 along z direction. According to some embodiments, the semiconductor layer L1 corresponds to a front end of line (FEOL) layer of the wafer.

As depicted in FIG. 1, the voltage generator 121 is coupled to the voltage regulator circuit 123 through a first set of routing conductive contacts disposed between the semiconductor layers L1 and L3. The voltage regulator circuit 123 is coupled to the function circuit 124 through a second set of routing conductive contacts disposed between the semiconductor layers L1 and L3.

The configurations of FIG. 1 are given for illustrative purposes. Various implements are within the contemplated scope of the present disclosure. For example, in some embodiments, the electrode 131 includes a metal structure formed as a metal trace extending in x direction.

Figure 2:
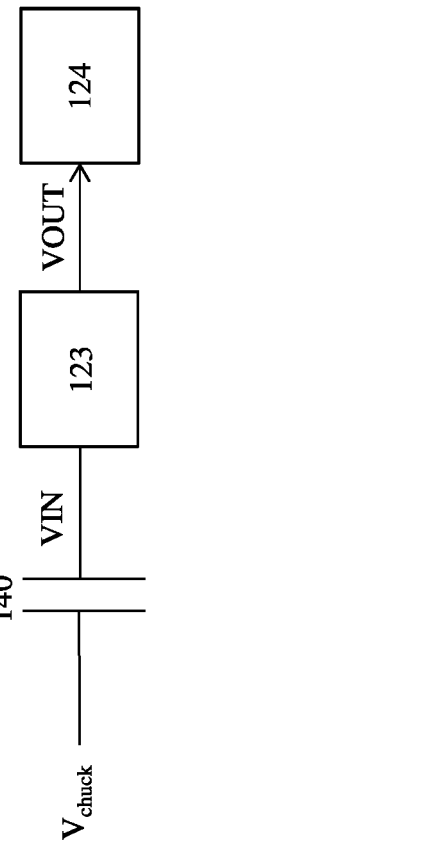
FIG. 2 is a block diagram corresponding to a system of FIG. 1, in accordance with some embodiments.

Reference is now made to FIG. 2. FIG. 2 is a block diagram corresponding to the system 100 of FIG. 1, in accordance with various embodiments. For illustration, in some embodiments, the metal structure 121a and the electrode 131 are configured to form a capacitor 140, in which the metal structure 121a corresponds to a terminal of the capacitor 140 and the electrode 131 corresponds to the other terminal of the capacitor 140.

In some embodiments, the capacitor 140 is charged in response to the voltage $V_{chuck}$ and configured to generate the voltage VIN to the voltage regulator circuit 123. The voltage regulator circuit 123 is configured to generate a voltage VOUT to the function circuit 124 by regulating the voltage VIN. In some embodiments, the function circuit 124 operates with the voltage VOUT. In various embodiments, the voltage VOUT is a supply voltage to power the function circuit 124.

Figure 3:
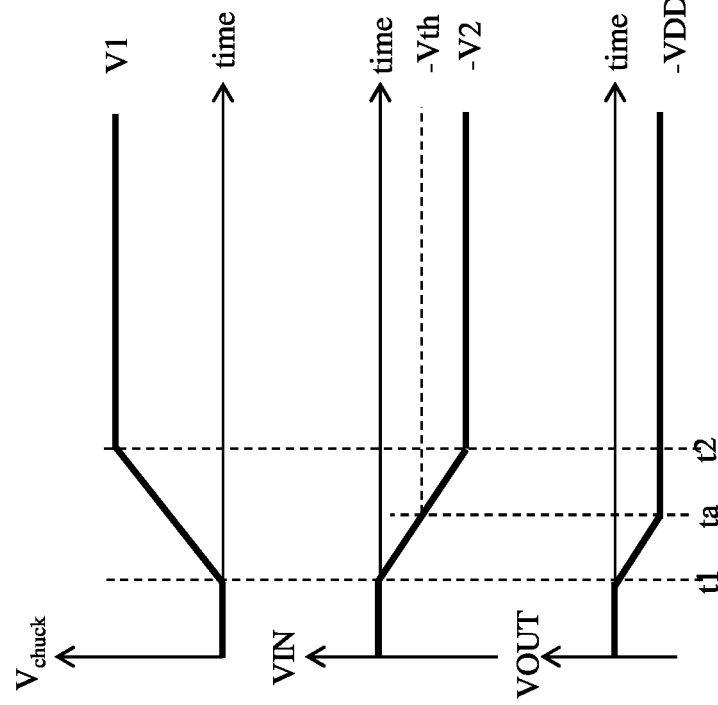
FIG. 3 is a timing diagram illustrating example voltages corresponding to a system of FIG. 1, in accordance with some embodiments.

Reference is now made to FIGS. 1 to 3. FIG. 3 is an example timing diagram of the voltage $V_{chuck}$, the voltage VIN of the voltage generator 121 and the voltage VOUT. In operation, as shown in FIG. 3, at time t1, the voltage $V_{chuck}$ increases from 0V. Induced negative charges, in response to the voltage $V_{chuck}$, accumulate on the metal structure 121a of the voltage generator 121. Accordingly, the voltage VIN decreases from 0V according to the charges. The voltage regulator circuit 123 receives the voltage VIN and outputs decreased voltage VOUT according to the voltage VIN.

In some embodiments, at time ta after time t1, the voltage VOUT has a voltage value −VDD (e.g., about −1.8V or −2.5V) when the voltage VIN is smaller than a threshold −Vth of the voltage regulator circuit 123. In various embodiments, the voltage VOUT is equal to the voltage VIN when the voltage VIN is larger than the threshold-Vth. In some embodiments, the function circuit 124 is configured to be powered by the voltage VOUT having the voltage value −VDD. In some embodiments, the threshold voltage Vth of the voltage regulator circuit 123 corresponds to a regulate voltage of the voltage regulator circuit 123 to determine the voltage range of its output voltage.

At time t2 after the time ta, the voltage $V_{chuck}$ has a voltage value V1 and the voltage VIN has a voltage value −V2. In some embodiments, the voltage value V1. (e.g., about 3000V) is greater than the voltage value −V2 (e.g., about −10V) in magnitude.

Figure 4:
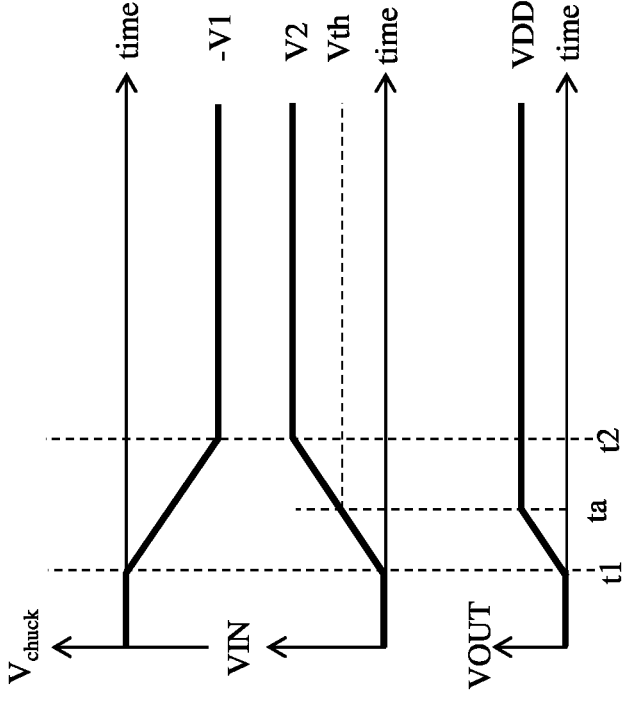
FIG. 4 is a timing diagram illustrating example voltages corresponding to a system of FIG. 1, in accordance with some embodiments.

Reference is now made to FIGS. 1-2 and 4. FIG. 4 is an example timing diagram of the voltage $V_{chuck}$, the voltage VIN of the voltage generator 121 and the voltage VOUT. In operation, as shown in FIG. 4, at time t1, the voltage $V_{chuck}$ decreases from 0V. Induced positive charges, in response to the voltage $V_{chuck}$, accumulate on the metal structure 121a of the voltage generator 121. Accordingly, the voltage VIN increases from 0V according to the charges. The voltage regulator circuit 123 receives the voltage VIN and outputs increased voltage VOUT according to the voltage VIN.

In some embodiments, at time ta after time t1, the voltage VOUT has a voltage value VDD (e.g., about 1.8V or 2.5V) when the voltage VIN is smaller than a threshold Vth of the voltage regulator circuit 123. In various embodiments, the voltage VOUT is equal to the voltage VIN when the voltage VIN is larger than the threshold Vth. In some embodiments, the function circuit 124 is configured to be powered by the voltage VOUT having the voltage value VDD.

At time t2 after the time ta, the voltage $V_{chuck}$ has a voltage value −V1 and the voltage VIN has a voltage value V2. In some embodiments, the voltage value −V1. (e.g., about −3000V) is greater than the voltage value V2 (e.g., about 10V) in magnitude.

The configurations of FIGS. 3 and 4 are given for illustrative purposes. Various implements are within the contemplated scope of the present disclosure. For example, in some embodiments, the voltage value V1, the voltage value V2 and the voltage value VDD are not equal to the example values described above.

Figure 5:
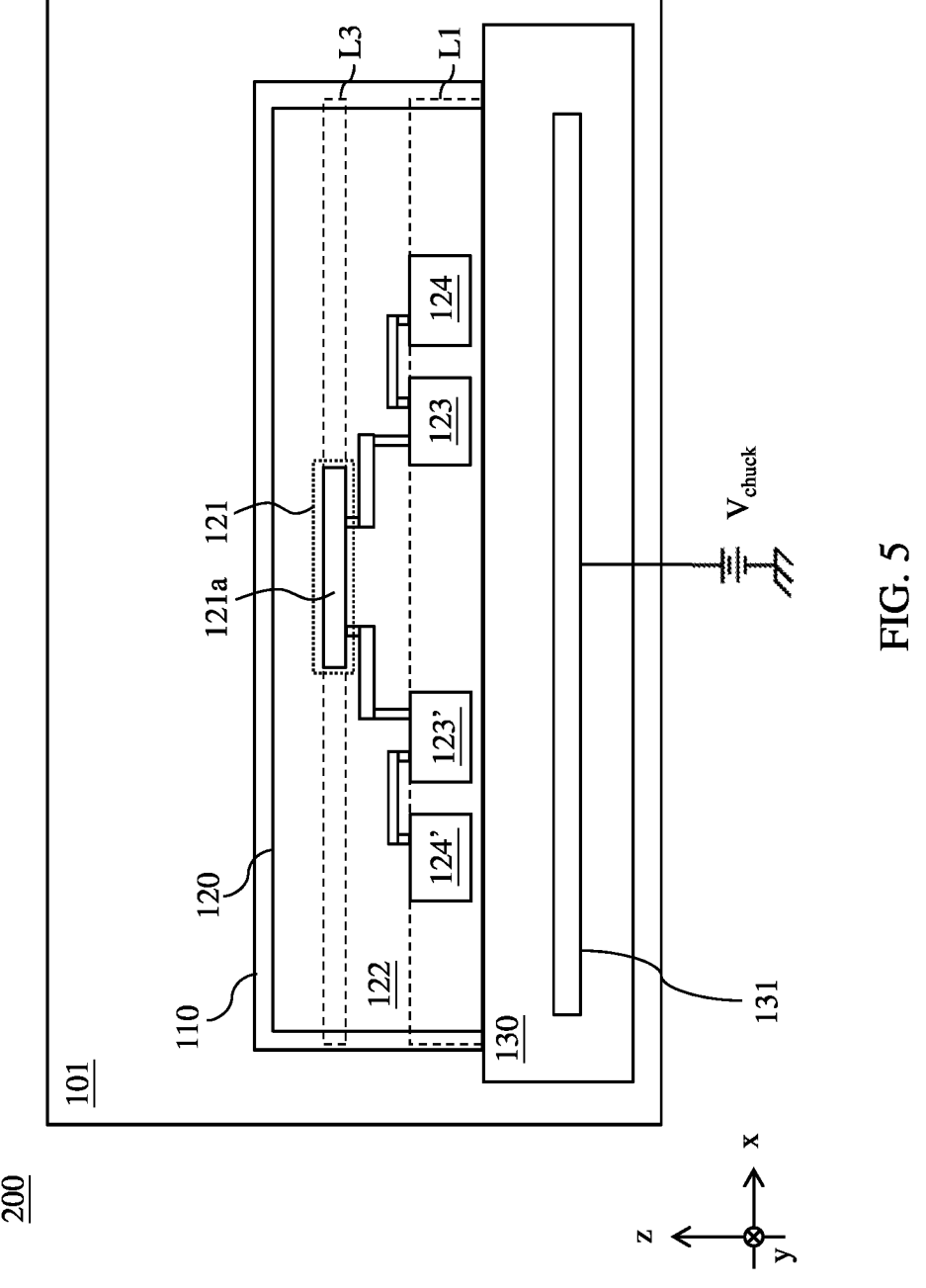
FIG. 5 is a schematic diagram illustrating a system, in accordance with some embodiments.

Reference is now made to FIG. 5. FIG. 5 is a schematic diagram of a system 200, in accordance with various embodiments. With respect to the embodiments of FIGS. 1-4, like elements in FIG. 5 are designated with the same reference numbers for ease of understanding. The specific operations of similar elements, which are already discussed in detail in above paragraphs, are omitted herein for the sake of brevity.

Compared with the system 100, the die 120 of the system 200 further includes a voltage regulator circuit 123' and a function circuit 124'. The voltage regulator circuit 123' is configured with respect to, for example, the voltage regulator circuit 123. The function circuit 124' is configured with respect to, for example, the function circuit 124. As depicted in FIG. 5, the voltage regulator circuit 123' and the function circuit 124' are disposed in the semiconductor layer L1. The voltage regulator circuit 123' is coupled to the voltage generator 121 through a third set of routing conductive contacts disposed between the semiconductor layers L1 and L3. The function circuit 124' is coupled to the voltage regulator circuit 123' through a fourth set of routing conductive contacts disposed between the semiconductor layers L1 and L3. In some embodiments, the threshold values of the voltage regulator circuit 123 and 123' are different. Accordingly, the output voltages of the voltage regulator circuit 123 and 123' are different. In some embodiments, the function circuits 124 and 124' are configured to execute different functions. For example, the function circuits 124 and 124' are sensor circuits that sense different on-wafer parameters including a EUV light intensity, ion implantation intensity, or other suitable parameters in the manufacturing system.

The configurations of FIG. 5 are given for illustrative purposes. Various implements are within the contemplated scope of the present disclosure. For example, in some embodiments, the die 120 includes more than two voltage regulator circuits and includes more than two function circuits.

Figure 6:
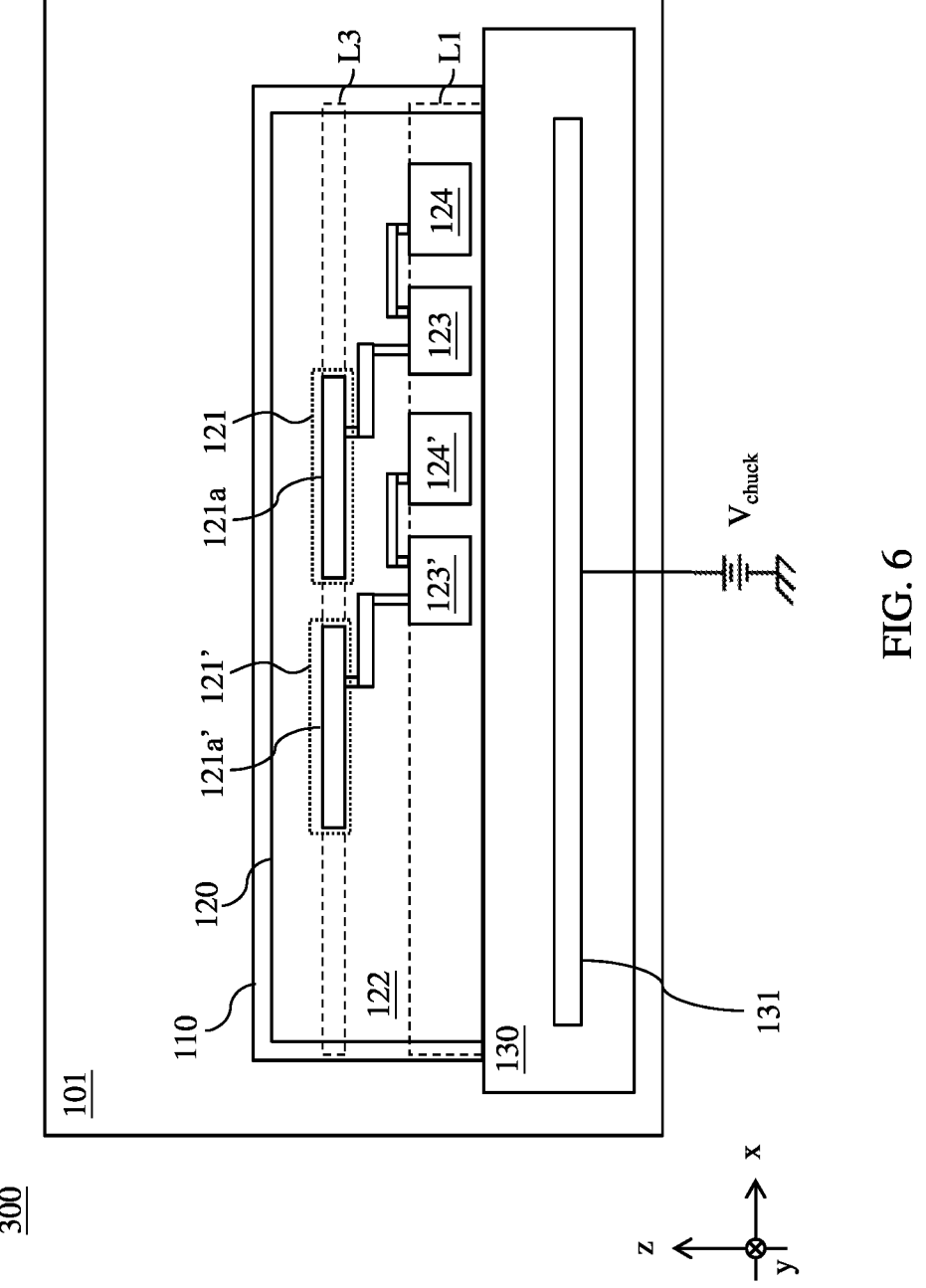
FIG. 6 is a schematic diagram illustrating a system, in accordance with some embodiments.

Reference is now made to FIG. 6. FIG. 6 is a schematic diagram of a system 300, in accordance with various embodiments. With respect to the embodiments of FIGS. 1-5, like elements in FIG. 6 are designated with the same reference numbers for ease of understanding.

Compared with the system 100 of FIG. 1, the die 120 of the system 300 further includes a voltage generator 121', a voltage regulator circuit 123' and a function circuit 124'. In some embodiments, the voltage generator 121' and the metal structure 121a' are configured with respect to, for example, the voltage generator 121 and the metal structure 121a respectively. For illustration, the voltage generator 121' is surrounded by the dielectric layer 122 and is isolated from the chuck 130 by the dielectric layer 122. The voltage generator 121' is disposed in the semiconductor layer L3. The voltage generator 121' includes a metal structure 121a'. As shown in the embodiments of FIG. 6, the metal structure 121a' at least extends in x direction in a shape of a metal line.

In various embodiments, the metal structure 121a' is in a shape of a metal sheet disposed in the semiconductor layer L3.

As depicted in FIG. 6, the voltage regulator circuit 123' and the function circuit 124' are disposed in the semiconductor layer L1. The voltage generator 121' is coupled to the voltage regulator circuit 123' through a third set of routing conductive contacts disposed between the semiconductor layers L1 and L3. The voltage regulator circuit 123' is coupled to the function circuit 124' through a fourth set of routing conductive contacts disposed between the semiconductor layers L1 and L3.

In some embodiments, the threshold values of the voltage regulator circuit 123 and 123' are different. In some embodiments, the function circuits 124 and 124' are configured to execute different functions. For example, the function circuits 124 and 124' are sensor circuits configured to generate sensed values corresponding to different on-wafer parameters including a EUV light intensity, ion implantation intensity, etc. In some embodiments, the function circuit 124 and/or 124' are configured to generate signals of sensed values in response to signals, for example Raman signals, transmitted from a process control device in the chamber 101 to the function circuit 124 and/or 124'. The process control device then receives the signals of sensed values for process control.

Figure 7:
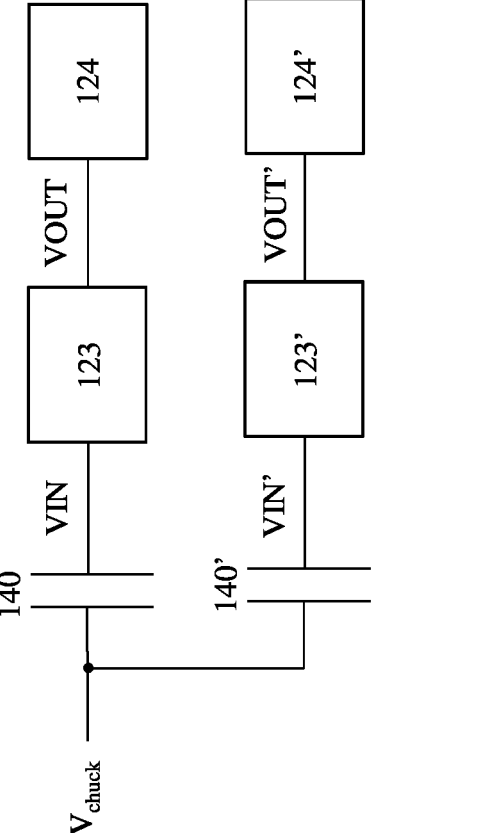
FIG. 7 is a block diagram corresponding to a system of FIG. 6, in accordance with some embodiments.

Reference is now made to FIGS. 6 and 7. FIG. 7 is a block diagram of the system 300, in accordance with various embodiments. For illustration, in some embodiments, the metal structure 121a' and the electrode 131 are configured to form a capacitor 140', in which the metal structure 121a' corresponds to a terminal of the capacitor 140' and the electrode 131 corresponds to the other terminal of the capacitor 140'.

In some embodiments, the capacitor 140' is charged in response to the voltage $V_{chuck}$ and configured to generate the voltage VIN' to the voltage regulator circuit 123'. The voltage regulator circuit 123' is configured to generate a voltage VOUT' to the function circuit 124' by regulating the voltage VIN'. In some embodiments, the function circuit 124' operates with the voltage VOUT'. In various embodiments, the voltage VOUT' is a supply voltage to power the function circuit 124'.

Reference is now made to FIG. 8. FIG. 8 is a schematic diagram corresponding to parts of the system 300 in FIG. 7 in a layout view, in accordance with various embodiments. With respect to the embodiments of FIGS. 1-7, like elements in FIG. 8 are designated with the same reference numbers for ease of understanding. For illustration, the metal structure 121a and the electrode 131 overlap in the layout view. The metal structure 121a' and the electrode 131 overlap in the layout view. The metal structure 121a and the metal structure 121a' are separated from each other in the layout view. In some embodiments, the metal structure 121a and the metal structure 121a' are different in shape and/or size.

The configurations of FIG. 8 are given for illustrative purposes. Various implements are within the contemplated scope of the present disclosure. For example, in some embodiments, the system 300 includes more than two metal structures separated from each other in the layout view.

Figure 9:
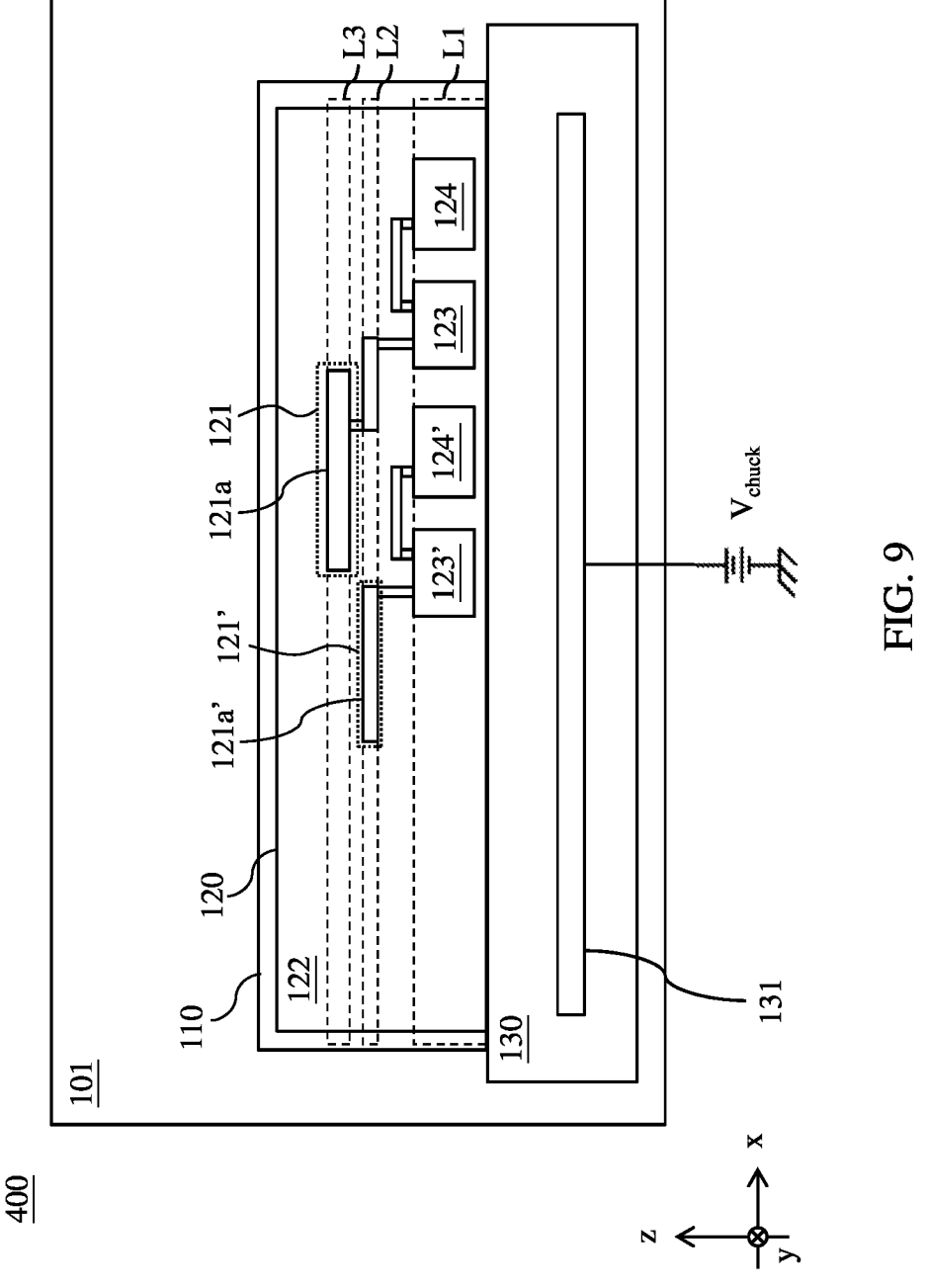
FIG. 9 is a schematic diagram illustrating a system, in accordance with some embodiments.

Reference is now made to FIG. 9. FIG. 9 is a schematic diagram of a system 400, in accordance with various embodiments. With respect to the embodiments of FIG. 6, like elements in FIG. 9 are designated with the same reference numbers for ease of understanding.

Compared with the system 300 of FIG. 6, the voltage generator 121' of the system 400 is disposed in a semiconductor layer L2 below the semiconductor layer L3 along z direction and over the semiconductor layer L1. In some embodiments, the metal structure 121a' of the voltage generator 121' of the system 400 is in a shape of a metal sheet disposed in the semiconductor layer L2. In some embodiments, the metal structure 121a' of the system 300 is thicker than the metal structure 121a' of the system 400 in z direction.

The configurations of FIG. 9 are given for illustrative purposes. Various implements are within the contemplated scope of the present disclosure. For example, in some embodiments, the 121a' is disposed in a semiconductor layer L4 above the L3 in z direction, as shown in FIG. 9. Accordingly, the distance between the 121a' and the 131 is greater from that between the 121a and the 131.

Figure 10:
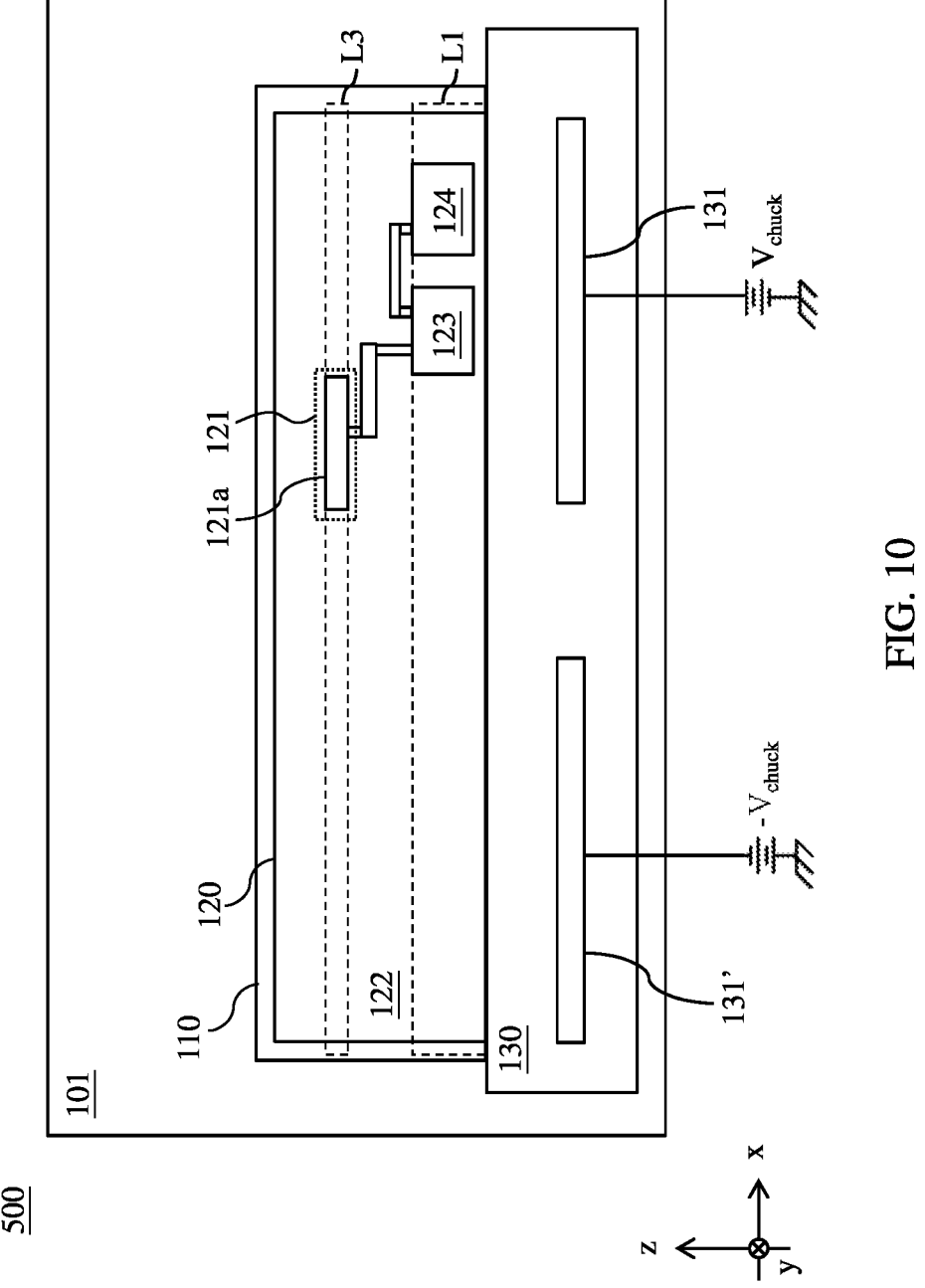
FIG. 10 is a schematic diagram illustrating a system, in accordance with some embodiments.

Reference is now made to FIG. 10. FIG. 10 is a schematic diagram of a system 500, in accordance with various embodiments. With respect to the embodiments of FIGS. 1-9, like elements in FIG. 10 are designated with the same reference numbers for ease of understanding.

The difference between the system 100 and the system 500 is that the chuck 130 of the system 500 further includes an electrode 131'. In some embodiments, the 131' is configured with respect to, for example, the electrode 131. As shown in FIG. 10, the electrode 131' is configured to receive a voltage $-V_{chuck}$ that is opposite to the voltage $V_{chuck}$ in polarity to generate an electrostatic force between the chuck 130 and the device 110 to fix the device 110 on the chuck 130. According to some embodiments, the electrodes 131 and 131' are separated from each other along the x direction.

Figure 11:
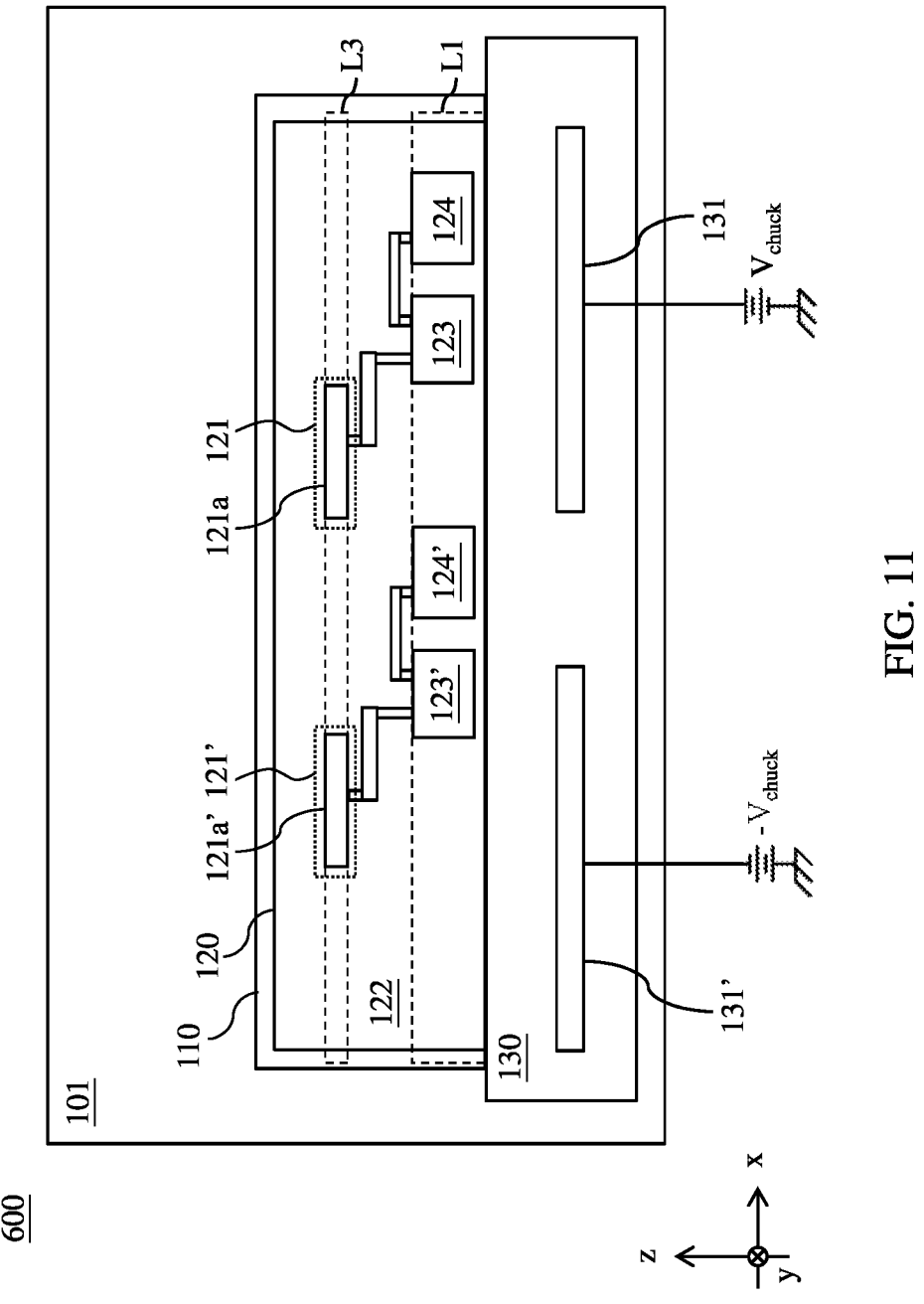
FIG. 11 is a schematic diagram illustrating a system, in accordance with some embodiments.

Reference is now made to FIG. 11. FIG. 11 is a schematic diagram of a system 600, in accordance with various embodiments. Compared with the system 500 of FIG. 10, the die 120 of the system 600 further includes the voltage generator 121', the voltage regulator circuit 123' and the function circuit 124'. With respect to the embodiments of FIGS. 1-10, like elements in FIG. 11 are designated with the same reference numbers for ease of understanding. In the embodiments of FIG. 11, the voltage generator 121' is disposed above the electrode 131' along the z direction.

The configurations of FIG. 11 are given for illustrative purposes. Various implements are within the contemplated scope of the present disclosure. For example, in some embodiments, the voltage generator 121' is disposed in a semiconductor layer below the semiconductor layer L3 and above the semiconductor layer L1.

Figure 12:
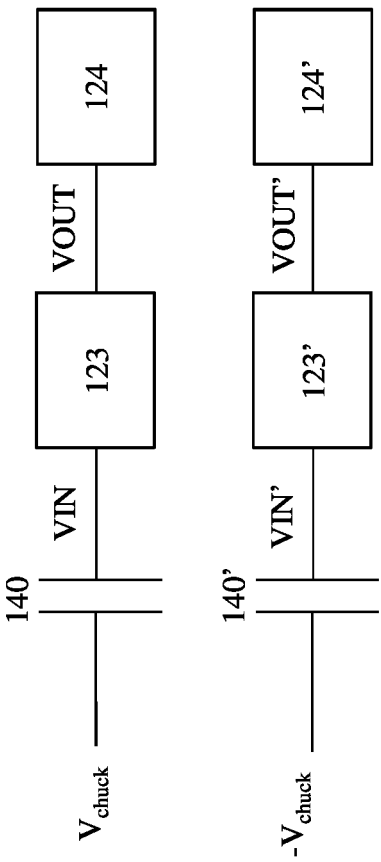
FIG. 12 is a block diagram corresponding to a system of FIG. 11, in accordance with some embodiments.

Reference is now made to FIG. 12. FIG. 12 is a block diagram of the system 600, in accordance with various embodiments. For illustration, in some embodiments, the metal structure 121a' and the electrode 131' are configured to form a capacitor 140', in which the metal structure 121a' corresponds to a terminal of the capacitor 140' and the electrode 131' corresponds to the other terminal of the capacitor 140'.

In some embodiments, the capacitor 140' is charged in response to the voltage $-V_{chuck}$ and configured to generate the voltage VIN' to the voltage regulator circuit 123'. The voltage regulator circuit 123' is configured to generate a voltage VOUT' to the function circuit 124' by regulating the voltage VIN'. According to some embodiments, the voltage VIN' is opposite to the voltage VIN in polarity and the voltage VOUT' is opposite to the voltage VOUT in polarity. In some embodiments, the function circuit 124' operates with the voltage VOUT'. In various embodiments, the voltage VOUT' is a supply voltage to power the function circuit 124'.

In some embodiments, the capacitance values of the capacitor 140 and 140' are respectively associated to the distance between the metal structure 121a and the electrode 131 and the distance between the metal structure 121a' and the electrode 131'. In some embodiments, the distances described above are different while the metal structures 121a and 121a' are disposed in different layers. Accordingly, the capacitance values of the capacitor 140 and 140' are different.

Figure 13:
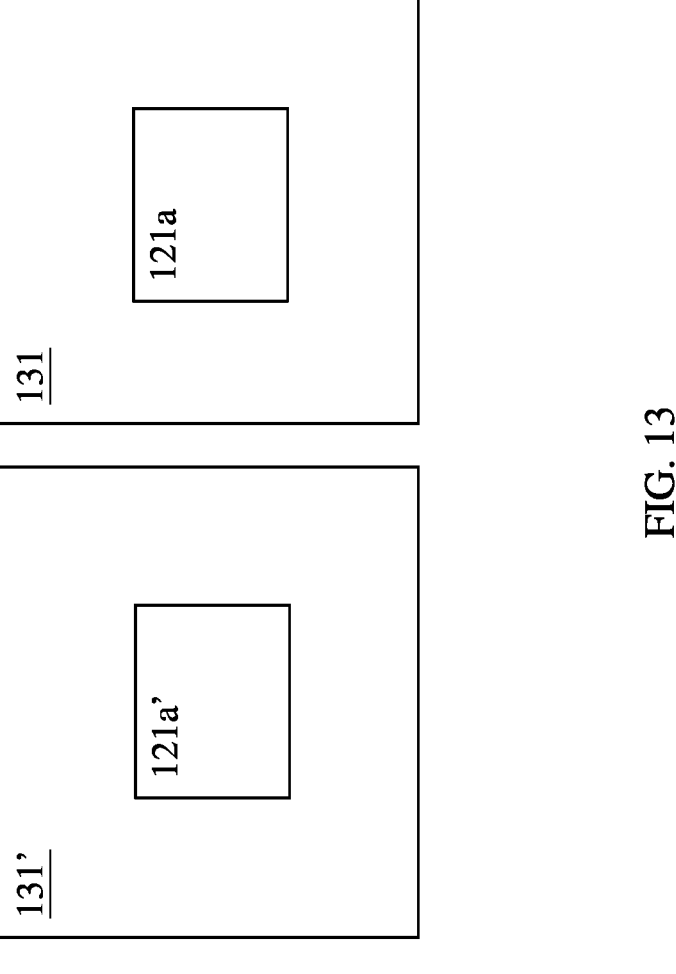
FIG. 13 is a schematic diagram illustrating parts of a system in a layout view, in accordance with some embodiments.

Reference is now made to FIG. 13. FIG. 13 is a schematic diagram corresponding to parts of the system 600 of FIG. 12 in a layout view, in accordance with various embodiments. For illustration, the metal structure 121a and the electrode 131 overlap in the layout view. The metal structure 121a' and the electrode 131' overlap in the layout view. The metal structure 121a and the metal structure 121a' are separated from each other in the layout view. In some embodiments, the metal structure 121a and the metal structure 121a' are different in shape and/or size.

The configurations of FIG. 13 are given for illustrative purposes. Various implements are within the contemplated scope of the present disclosure. For example, in some embodiments, the system 600 includes more metal structures overlapping the electrode 131 and separated from each other in the layout view. In some embodiments, the system 600 includes more metal structures overlapping the electrode 131' and separated from each other in the layout view.

Figure 14:
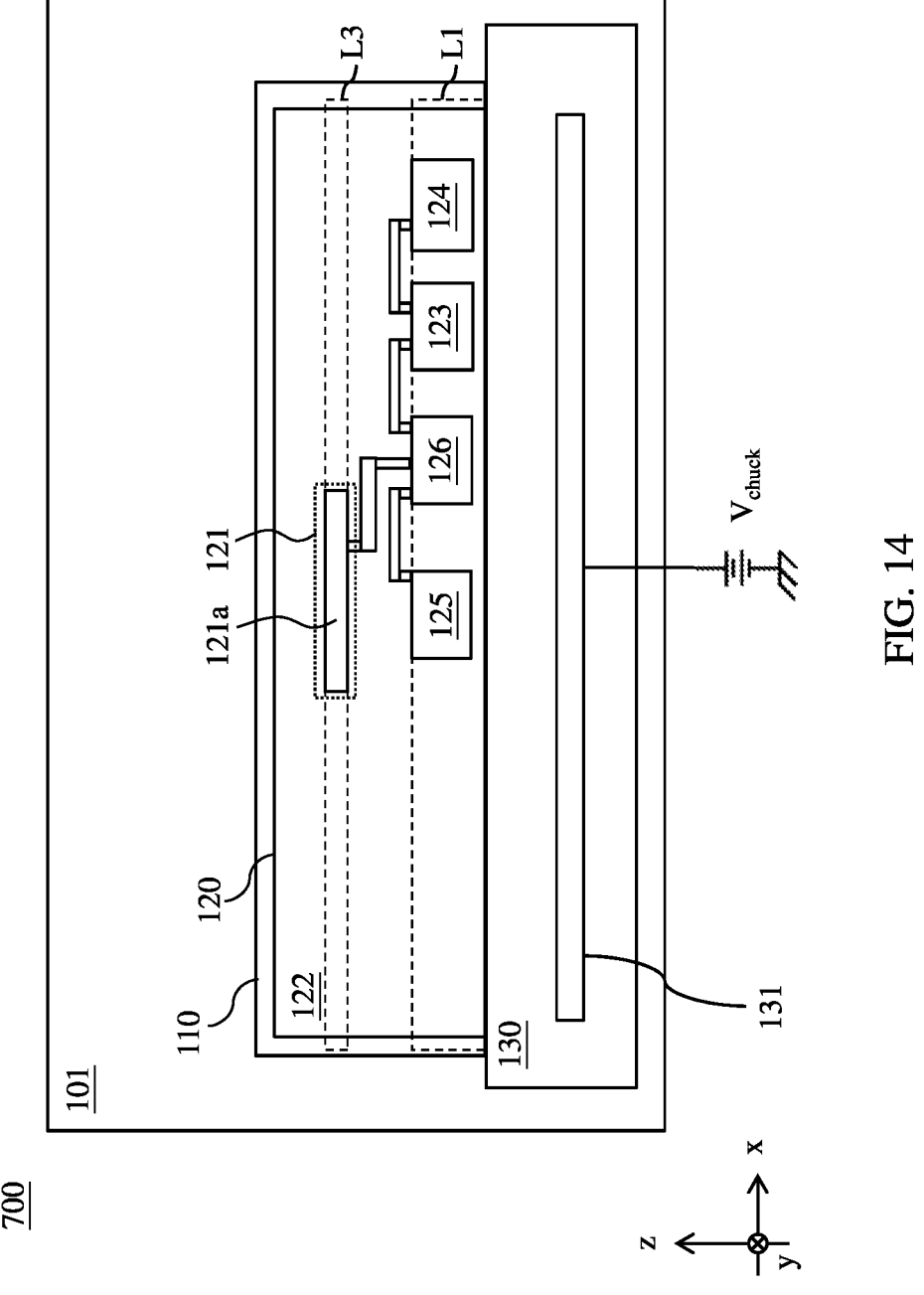
FIG. 14 is a schematic diagram illustrating a system, in accordance with some embodiments.

Reference is now made to FIG. 14. FIG. 14 is a schematic diagram of a system 700, in accordance with various embodiments. With respect to the embodiments of FIGS. 1-13, like elements in FIG. 14 are designated with the same reference numbers for ease of understanding. Compared with the system 100 of FIG. 1, the system 700 further includes an enabling circuit 125 and a switch 126. For illustration, the enabling circuit 125 and the switch 126 are disposed in the semiconductor layer L1.

As depicted in FIG. 14, the voltage generator 121 is coupled to the switch 126 through a first set of routing conductive contacts disposed between the semiconductor layers L1 and L3. The voltage regulator circuit 123 is coupled to the function circuit 124 and the switch 126 through second and third sets of routing conductive contacts respectively. The enabling circuit 125 is coupled to the switch 126 through a fourth set of routing conductive contacts disposed between the semiconductor layers L1 and L3.

The configurations of FIG. 14 are given for illustrative purposes. Various implements are within the contemplated scope of the present disclosure. For example, in some embodiments, the voltage regulator circuit 123 includes the switch 126.

Figure 15:
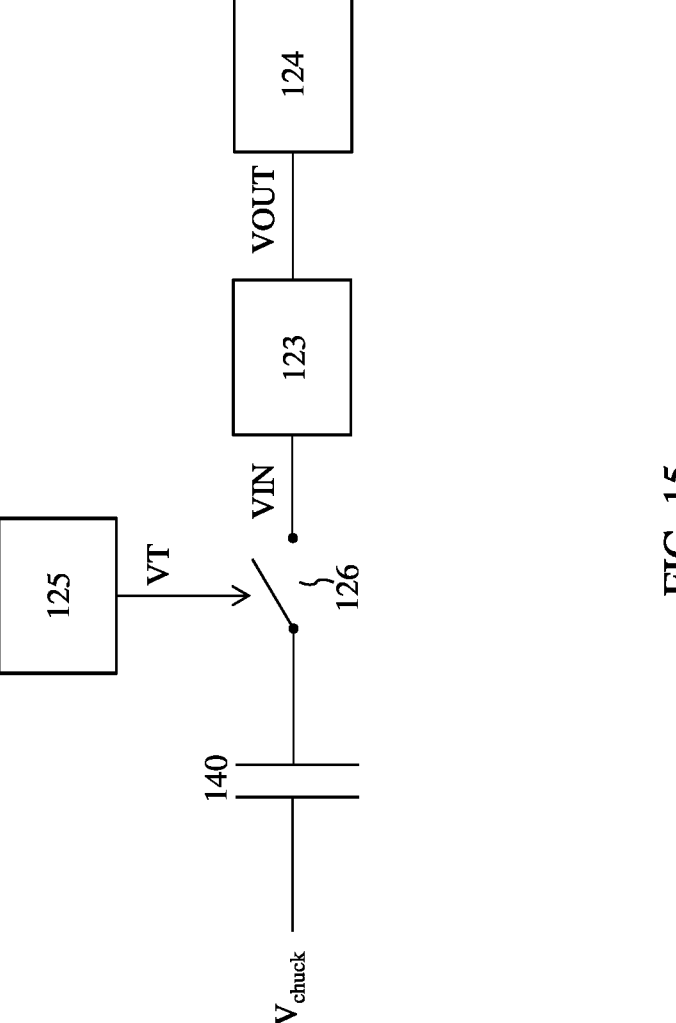
FIG. 15 is a block diagram corresponding to a system of FIG. 14, in accordance with some embodiments.

Reference is now made to FIG. 15. FIG. 15 is a block diagram corresponding to the system 700 of FIG. 14, in accordance with various embodiments. In some embodiments, the capacitor 140 (formed with the metal structure 121a and the electrode 131 as described in paragraphs corresponding to FIG. 2) is charged in response to the voltage $V_{chuck}$. The enabling circuit 125 is configured to generate a trigger signal (e.g., voltage VT) to turn on the switch 126. When the switch 126 is turned on, the voltage VIN is transmitted to the voltage regulator circuit 123 from the capacitor 140. The voltage regulator circuit 123 is configured to generate the voltage VOUT to the function circuit 124.

Figure 16:
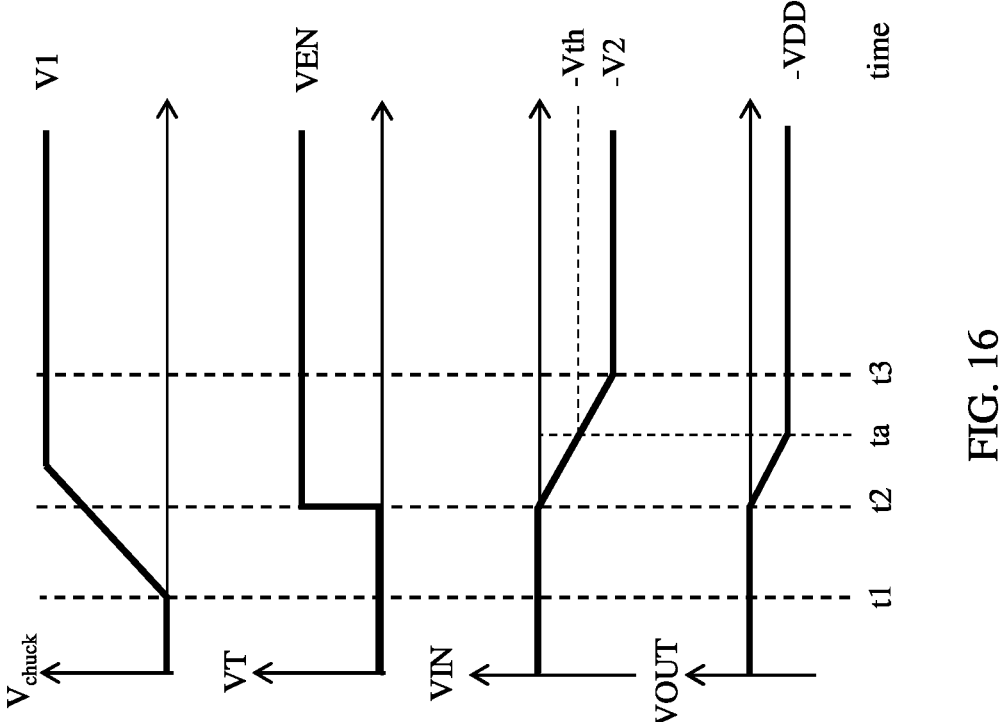
FIG. 16 is a timing diagram illustrating example voltages corresponding to a system of FIG. 15, in accordance with some embodiments.

Reference is now made to FIGS. 14 to 16. FIG. 16 is an example timing diagram of the voltage $V_{chuck}$, the voltage VT, the voltage VIN and the voltage VOUT. In operation, as shown in FIG. 16, at time t1, the voltage V$_{chuck}$ increases from 0V. Induced negative charges, in response to the voltage V$_{chuck}$, accumulate on the metal structure 121a of the voltage generator 121. At time t2, the voltage VT increases to turn on the switch 126. Accordingly, the voltage VIN decreases from 0V according to the charges on the metal structure 121a. The voltage regulator circuit 123 receives the voltage VIN and outputs decreased voltage VOUT according to the voltage VIN.

In some embodiments, at time ta after time t2, the voltage VOUT has a voltage value −VDD (e.g., about −1.8V or −2.5V) when the voltage VIN is smaller than a threshold −Vth of the voltage regulator circuit 123. In various embodiments, the voltage VOUT is equal to the voltage VIN when the voltage VIN is larger than the threshold-Vth. In some embodiments, the function circuit 124 is configured to be powered by the voltage VOUT having the voltage value −VDD.

At time t3 after the time ta, the voltage V$_{chuck}$ has a voltage value V1 and the voltage VIN has a voltage value −V2. In some embodiments, the voltage value V1. (e.g., about 3000V) is greater than the voltage value −V2 (e.g., about −10V) in magnitude.

The configurations of FIGS. 15 and 16 are given for illustrative purposes. Various implements are within the contemplated scope of the present disclosure. For example, in some embodiments, the voltage VT decreases from non-zero voltage to turn on the switch 126 that includes a PMOS transistor.

Figure 17:
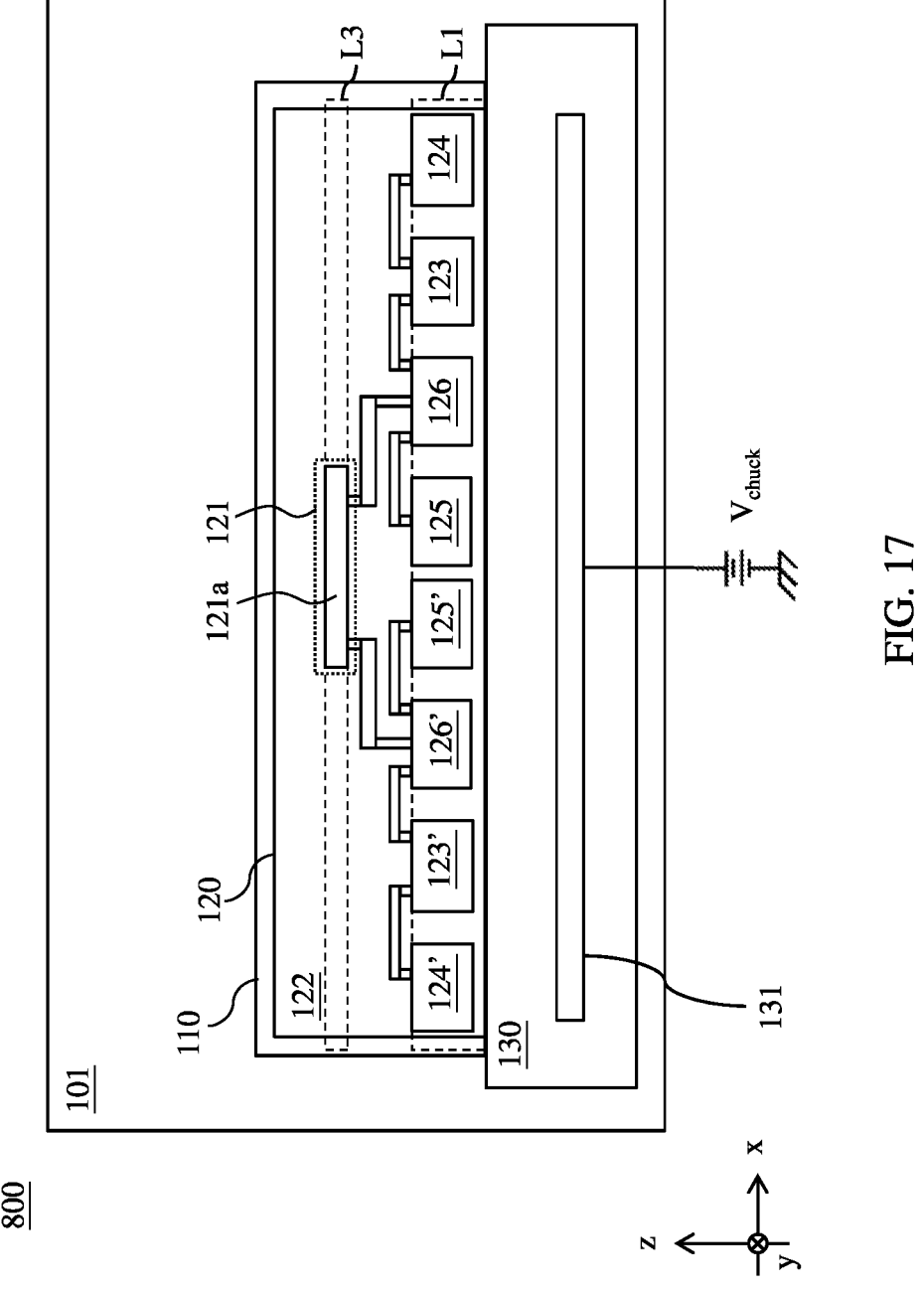
FIG. 17 is a schematic diagram illustrating a system, in accordance with some embodiments.

Reference is now made to FIG. 17. FIG. 17 is a schematic diagram of a system 800, in accordance with various embodiments. With respect to the embodiments of FIGS. 1-16, like elements in FIG. 17 are designated with the same reference numbers for ease of understanding.

The difference between the system 700 of FIG. 14 and the system 800 in FIG. 17 is that the die 120 of the system 800 further includes the voltage regulator circuit 123', the function circuit 124', an enabling circuit 125' and a switch 126'. For illustration, the voltage regulator circuit 123', the function circuit 124', the enabling circuit 125' and the switch 126' are disposed in the semiconductor layer L1.

As depicted in FIG. 17, the voltage generator 121 is coupled to the switch 126' through a first set of routing conductive contacts disposed between the semiconductor layers L1 and L3. The voltage regulator circuit 123' is coupled to the function circuit 124' and the switch 126' through second and third sets of routing conductive contacts respectively. The enabling circuit 125' is coupled to the switch 126' through a fourth set of routing conductive contacts disposed between the semiconductor layers L1 and L3.

The configurations of FIG. 17 are given for illustrative purposes. Various implements are within the contemplated scope of the present disclosure. For example, in some embodiments, the voltage regulator circuit 123' includes the switch 126'.

Figure 18:
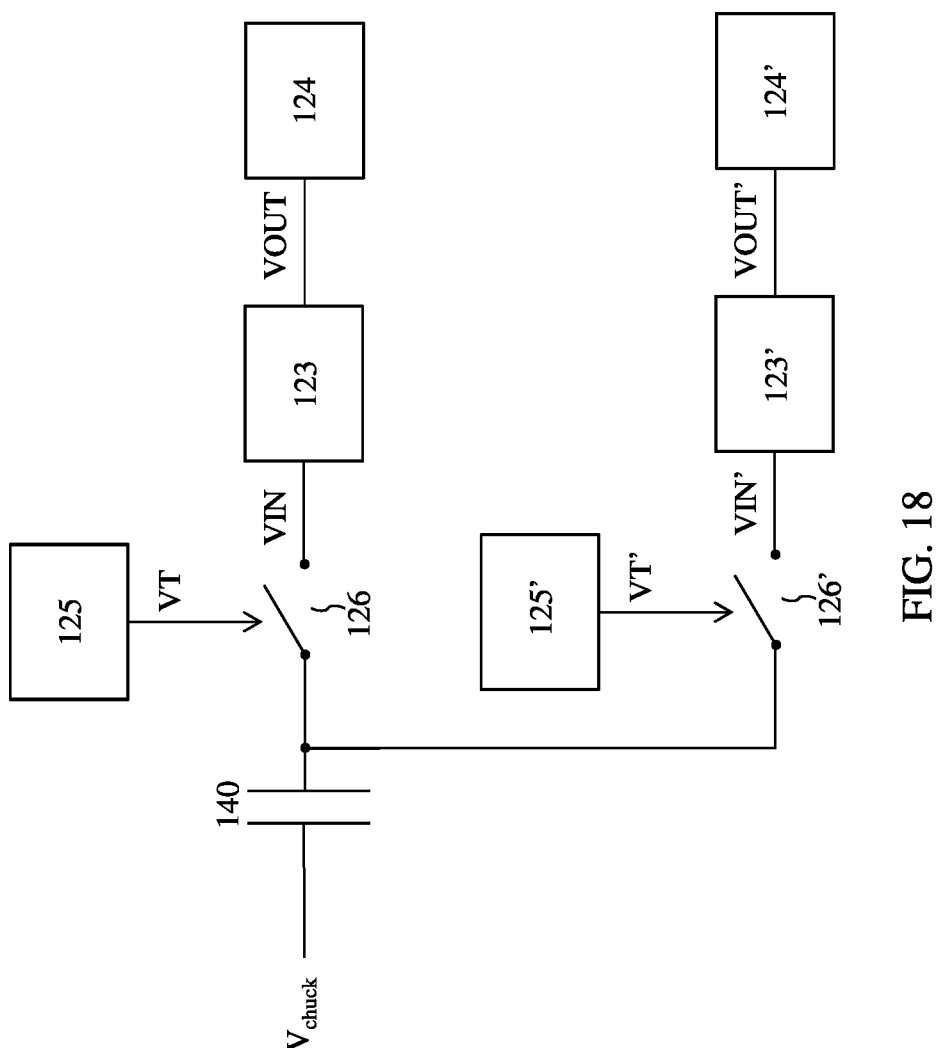
FIG. 18 is a block diagram corresponding to a system of FIG. 17, in accordance with some embodiments.

Reference is now made to FIG. 18. FIG. 18 is a block diagram corresponding to the system 800 of FIG. 17, in accordance with various embodiments.

Compared with FIG. 15, the capacitor 140 is further coupled to the switch 126'. The enabling circuit 125' is configured to generate a trigger signal (e.g., voltage VT') to turn on the switch 126'. When the switch 126' is turn on, a voltage VIN' is transmitted to the voltage regulator circuit 123' from the capacitor 140. The voltage regulator circuit 123' is configured to generate a voltage VOUT' to the function circuit 124' by regulating the voltage VIN'. In some embodiments, the function circuit 124' operates with the voltage VOUT'. In various embodiments, the voltage VOUT' is a supply voltage to power the function circuit 124'.

Figure 19:
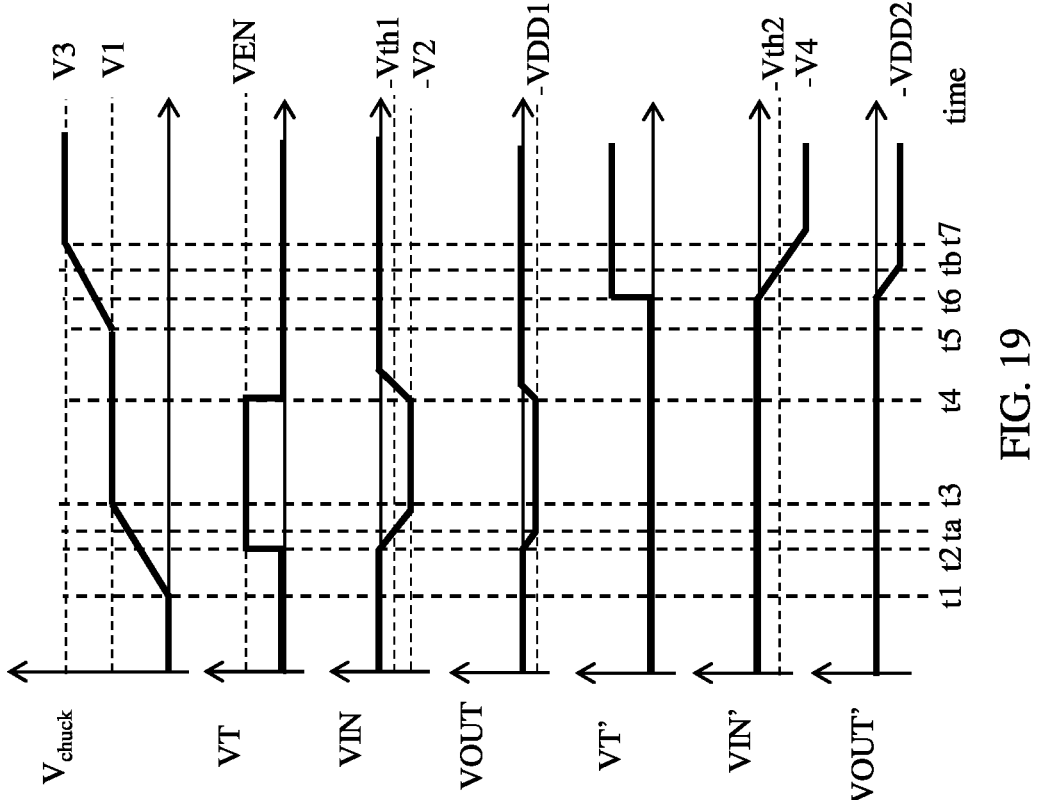
FIG. 19 is a timing diagram illustrating example voltages corresponding to a system of FIG. 17, in accordance with some embodiments.

Reference is now made to FIGS. 17 to 19. FIG. 19 is an example timing diagram of the voltage V$_{chuck}$, the voltage VT, the voltage VIN, the voltage VOUT, the voltage VT', the voltage VIN' and the voltage VOUT'. In operation, as shown in FIG. 19, at time t1, the voltage V$_{chuck}$ increases from 0V.

At time t2, the voltage VT increases to turn on the switch 126. Accordingly, the voltage VIN decreases from 0V according to the charges on the metal structure 121a. The voltage regulator circuit 123 receives the voltage VIN and outputs decreased voltage VOUT according to the voltage VIN.

At time t3 after the time ta, the voltage V$_{chuck}$ has the voltage value V1 and the voltage VIN has a voltage value −V2. In some embodiments, the voltage value V1 is greater than the voltage value −V2 in magnitude.

At time t4, the voltage VT falls to 0V to turn off the switch 126. Accordingly, the voltage VIN and the voltage VIN increase to 0V.

At time t5, the voltage V$_{chuck}$ further increases from the voltage V1. More induced charges, in response to the voltage V$_{chuck}$, accumulate on the metal structure 121a of the voltage generator 121.

In some embodiments, at time tb after time t6, the voltage VOUT' has a voltage value −VDD2 when the voltage VIN is smaller than a threshold −Vth2 of the voltage regulator circuit 123'. In various embodiments, the voltage VOUT' is equal to the voltage VIN' when the voltage VIN' is larger than the threshold −Vth2. In some embodiments, the function circuit 124' is configured to be powered by the voltage VOUT' having the voltage value −VDD2. At time t7 after the time tb, the voltage V$_{chuck}$ has a voltage value V3 larger than the voltage V1. The voltage VIN' has a voltage value −V4 smaller than the voltage value −V2. In some embodiments, the voltage value V3 is greater than the voltage value −V4 in magnitude.

At time t6, the voltage VT' increases to turn on the switch 126'. Accordingly, the voltage VIN' decreases from 0V according to the charges on the metal structure 121a. The voltage regulator circuit 123' receives the voltage VIN' and outputs decreased voltage VOUT' according to the voltage VIN'.

The configurations of FIGS. 18 and 19 are given for illustrative purposes. Various implements are within the contemplated scope of the present disclosure. For example, in some embodiments, the voltage value V$_{chuck}$ decreases at time t5 to have a voltage value smaller than the voltage value V1 and larger than 0V and the voltage value VIN' decreases to a voltage value larger than the voltage value −V2.

Figure 20:
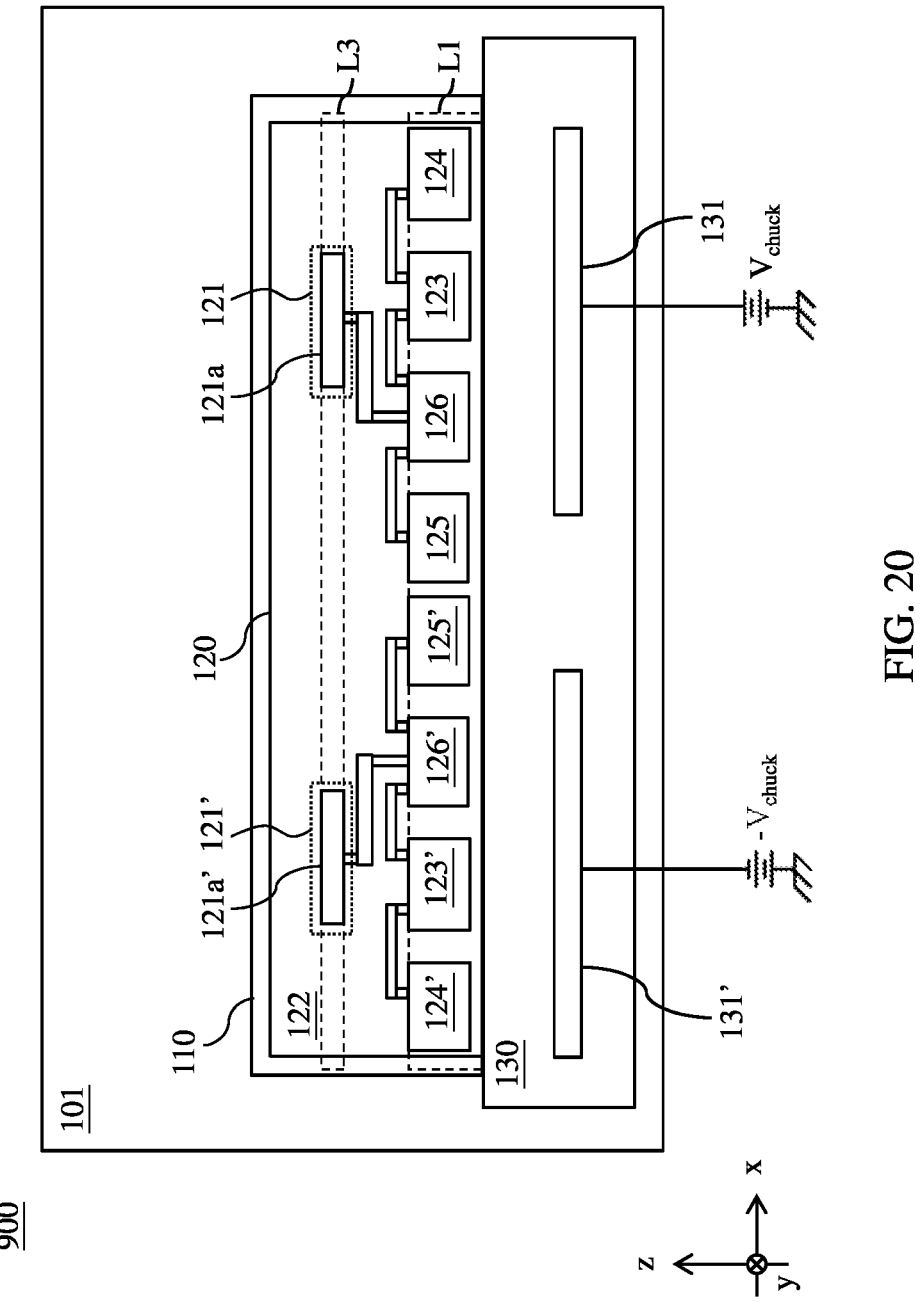
FIG. 20 is a schematic diagram illustrating a system, in accordance with some embodiments.

Reference is now made to FIG. 20. FIG. 20 is a schematic diagram of a system 900, in accordance with various embodiments. With respect to the embodiments of FIGS. 14-19, like elements in FIG. 20 are designated with the same reference numbers for ease of understanding.

Compared with the system 800 of FIG. 18, the die 120 of the system 600 further includes the voltage generator 121' to be coupled to the 123' through the turned on switch 126'. Furthermore, the voltage generator 121' is disposed above the electrode 131'.

The configurations of FIG. 20 are given for illustrative purposes. Various implements are within the contemplated scope of the present disclosure. For example, in some embodiments, the system 900 does not include the enabling circuit 125' and the switch 126' is coupled to the enabling circuit 125.

Figure 21:
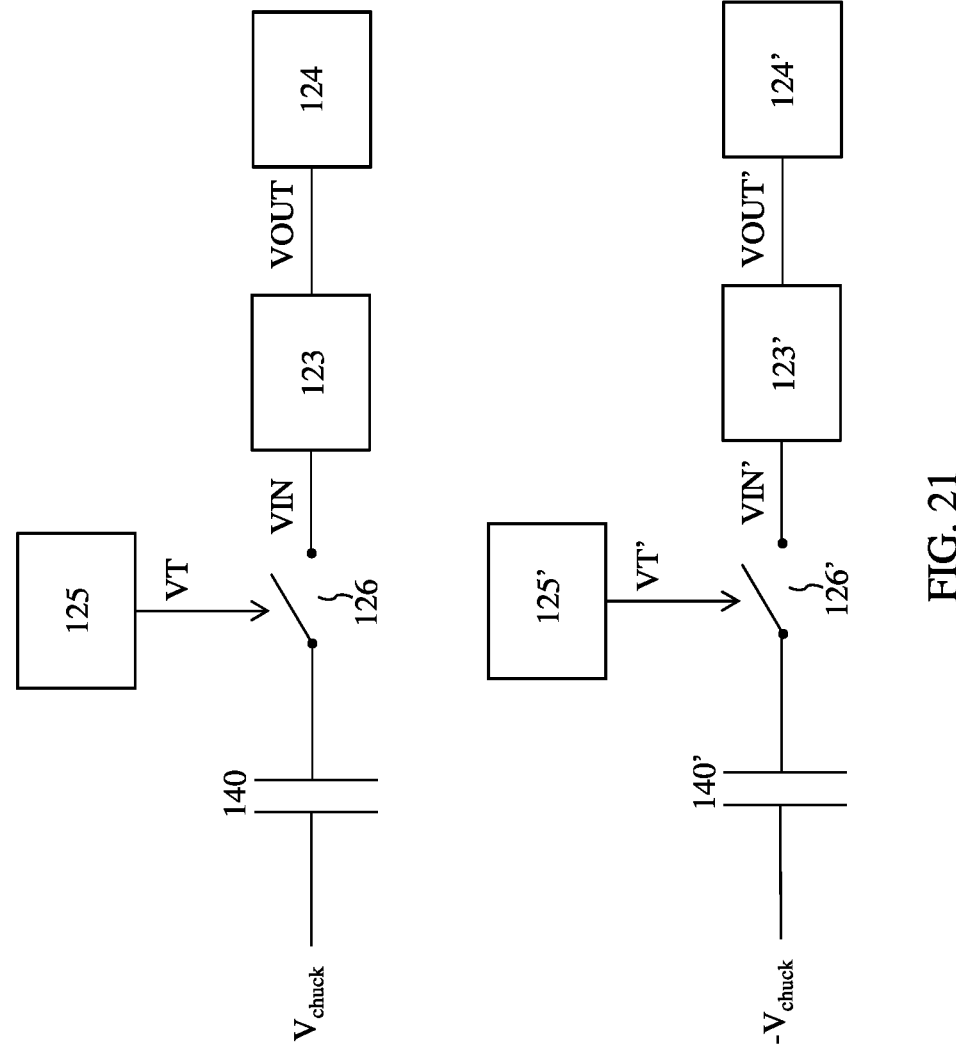
FIG. 21 is a block diagram of corresponding to system of FIG. 20, in accordance with some embodiments.

Reference is now made to FIG. 21. FIG. 21 is a block diagram of the system 900, in accordance with various embodiments. Compared with FIG. 18, instead of the switch 126' coupled to the capacitor 140, the switch 126' of FIG. 21 is coupled to the capacitor 140' which received the voltage $-V_{chuck}$.

Figure 22:
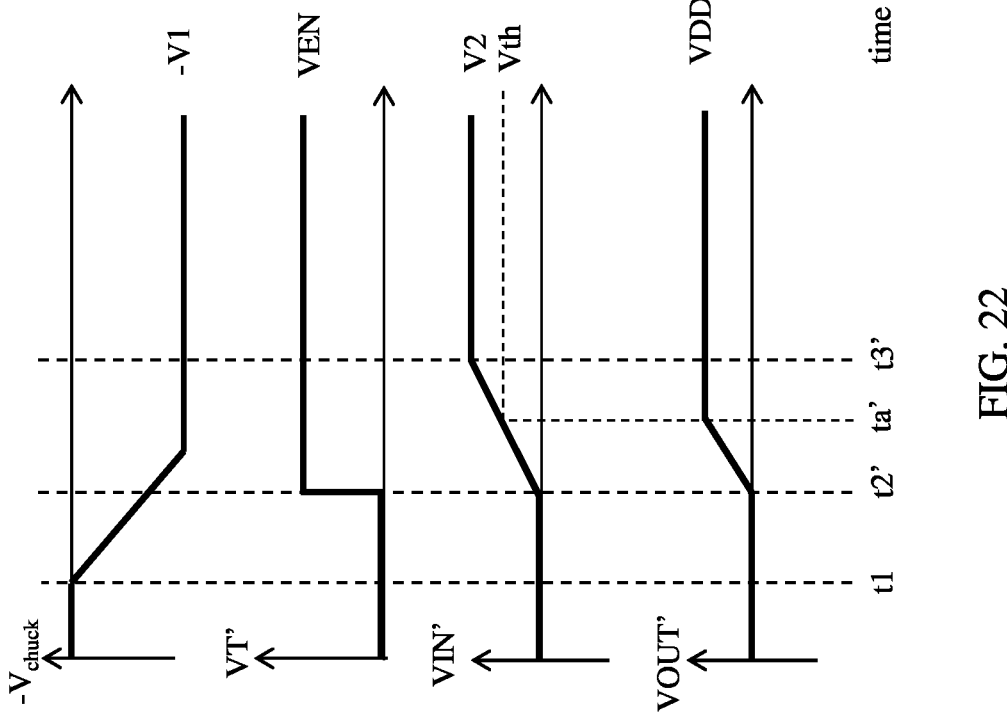
FIG. 22 is a timing diagram illustrating example voltages corresponding to a system of FIG. 20, in accordance with some embodiments.

FIG. 22 is an example timing diagram of the voltage $-V_{chuck}$, the voltage VT', the voltage VIN', and the voltage VOUT' that correspond to the embodiments of the capacitor 140', the voltage regulator circuit 123', the function circuit 124', the enabling circuit 125' and the switch 126' in FIG. 21.

In operation, as shown in FIG. 22, at time t1, the voltage $-V_{chuck}$ decreases from 0V. Induced charges, in response to the voltage $-V_{chuck}$, accumulate on the metal structure 121a' of the voltage generator 121'. At time t2', the voltage VT' increases to turn on the switch 126'. Accordingly, the voltage VIN' increases from 0V according to the charges on the metal structure 121a'. The voltage regulator circuit 123' receives the voltage VIN' and outputs the increased voltage VOUT' according to the voltage VIN'.

In some embodiments, at time ta' after time t2', the voltage VOUT' has a voltage value VDD (e.g., about 1.8V or 2.5V) when the voltage VIN' is larger than a threshold Vth of the voltage regulator circuit 123'. In various embodiments, the voltage VOUT' is equal to the voltage VIN' when the voltage VIN' is larger than the threshold Vth. In some embodiments, the function circuit 124' is configured to be powered by the voltage VOUT' having the voltage value VDD.

At time t3' after the time ta', the voltage $-V_{chuck}$ has a voltage value $-V1$ and the voltage VIN' has a voltage value V2. In some embodiments, the voltage value $-V1$. (e.g., about $-3000V$) is greater than the voltage value V2 (e.g., about 10V) in magnitude.

The configurations of FIGS. 21 and 22 are given for illustrative purposes. Various implements are within the contemplated scope of the present disclosure. For example, in some embodiments, the threshold of the voltage regulator circuit 123' is a value different threshold Vth.

Figure 23:
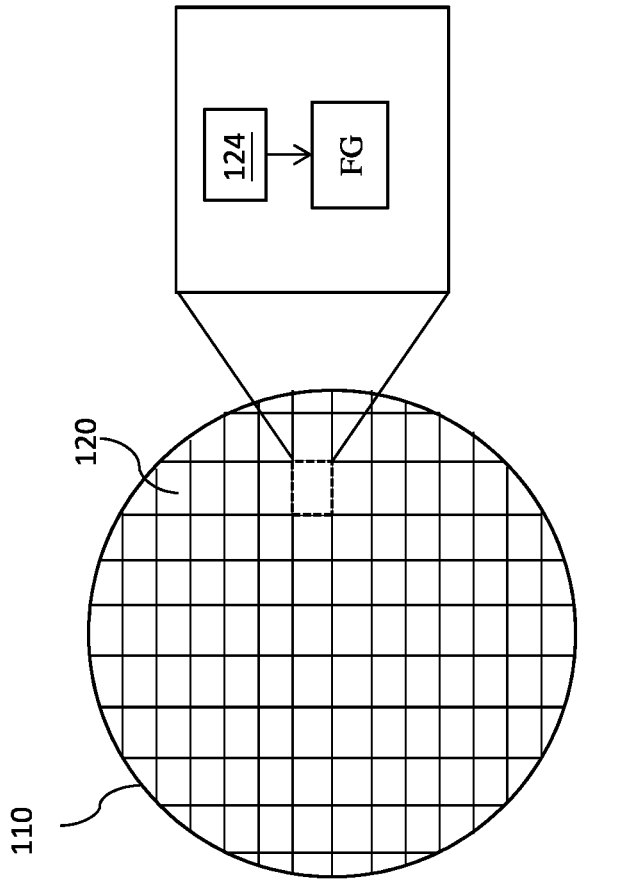
FIG. 23 is a schematic diagram illustrating a device, in accordance with some embodiments.

Reference is now made to FIG. 23. FIG. 23 is a schematic diagram of an example of the device 110 of the system 100, 200, 300, 400, 500, 600, 700, 800 or 900, in accordance with various embodiments. In some embodiments, the device 110 is a wafer including multiple dies 120. In various embodiments, each of the dies 120 includes the voltage regulator circuit 123, the function circuit 124, the enabling circuit 125, the switch 126 and at least one floating gate FG. The function circuit 124 is configured to sense at least one on-wafer parameter, for example, a EUV light intensity, ion implantation intensity, etc. and to generate a sensed value indicating the on-wafer parameter during a process to the wafer. The function circuit 124 is coupled to at least one memory unit, for example, a OTP memory including a floating gate FG, to transmit the sensed values the floating gate FG. Then the floating gate FG stores the sensed value. In some embodiments, the sensed value stored in the floating gate FG is output for process control.

Reference is now made to FIG. 24. FIG. 24 is a flow chart of a method 1000 of operating the system 100, 200, 300, 400, 500, 600, 700, 800 or 900, in accordance with some embodiments. It is understood that additional operations can be provided before, during, and after the processes shown by FIG. 23, and some of the operations described below can be replaced or eliminated, for additional embodiments of the method. The order of the operations/processes may be interchangeable. Throughout the various views and illustrative embodiments, like reference numbers are used to designate like elements. The method 1000 includes operations 801-803 that are described below with reference to FIGS. 14-16.

In operation 1001, the voltage $V_{chuck}$ of the electrode 131 in the chuck 130 is adjusted to modify a voltage of the metal structure 121a in the device 110 (e.g., a wafer) disposed on the chuck 130 at time t1.

In operation 1002, the voltage of the metal structure 121a is transmitted to the voltage regulator circuit 123 in the device 110 in response to the voltage VT at time t2.

In operation 1003, the voltage VOUT is generated, according to the voltage of the metal structure 121a, by the voltage regulator circuit 123 to operate the function circuit 124 in the device 110.

In some embodiments, an on-wafer parameter value is sensed by the function circuit 124 when the device 110 is in a manufacturing process in the chamber 101.

In some embodiments, with reference to FIGS. 17-19, the voltage $V_{chuck}$ is adjusted to modify the voltage of the metal structure 121a at a time t5 of FIG. 19. The voltage of the metal structure 121a is transmitted to the voltage regulator circuit 123' in response to the voltage VT' at time t6. The voltage VOUT' is generated, according to the voltage of the metal structure 121a, by the voltage regulator circuit 123' to operate the function circuit 124'.

In some embodiment, with reference to FIGS. 20-22, the voltage $-V_{chuck}$ opposite to the voltage $V_{chuck}$ is transmitted to the electrode 131' to generate the voltage of the metal structure 121a' at the time t1. The voltage of the metal structure 121a' is transmitted to the voltage regulator circuit 123' in response to the voltage VT' at the time t2'. The voltage VOUT' is generated, according to the voltage of the metal structure 121a', by the voltage regulator circuit 123' to operate the function circuit 124'.

As described above, the system of the present disclosure provides a device with a voltage generator including a metal structure. The metal structure and an electrode of a chuck form a capacitor. When the voltage applied to the electrode increases, the capacitor is charged. Accordingly, with the charges of the capacitor, the voltage generator is capable to provide a voltage output to a voltage regulator circuit to operate a function circuit of the device.

In some embodiments, a device in a chamber is provided. The device comprises at least one die. The at least one die comprise a first voltage generator, a dielectric layer and a first voltage regulator circuit. The first voltage generator is charged to have a first induced voltage by induced charges generated in response to a first voltage of a first electrode of a chuck in the chamber. The dielectric layer surrounds the first voltage generator to isolate the first voltage generator from the first electrode. The first voltage regulator circuit is coupled to the first voltage generator to receive the first induced voltage and generates a first power supply voltage according to the first induced voltage for a first circuit in the device.

In some embodiments, a system is provided. The system includes a chuck and a wafer. The chuck includes a first metal structure receiving a first supply voltage. The wafer is disposed above the chuck and includes a second metal structure, a first enabling circuit and a first function circuit. The second metal structure is disposed in a first semiconductor layer of the wafer. The first and second metal structures form a first capacitor. The first metal structure corresponds to a first terminal of the first capacitor. The second metal structure corresponds to a second terminal of the first capacitor. The second metal structure transmits a first voltage in response to the first supply voltage. The first enabling circuit disposed in a second semiconductor layer under the first semiconductor layer and configured to generate a first trigger signal. The first function circuit is disposed in the second semiconductor layer and operates with a second voltage generated associated with the first voltage that is transmitted through a first switch in response to the first trigger signal.

In some embodiments, a method is provided. The method includes: adjusting a first voltage of a first electrode in a chuck to modify a second voltage of a metal structure in a wafer disposed on the chuck at a first time; transmitting the second voltage to a first voltage regulator circuit in the wafer in response to a first trigger signal at a second time after the first time; and generating a first supply voltage, according to the second voltage, by the first voltage regulator circuit to operate a first function circuit in the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device in a chamber, comprising:
at least one die comprising:
    a first voltage generator configured to be charged to have a first induced voltage by induced charges generated in response to a first voltage of a first electrode of a chuck in the chamber,
    wherein the first voltage generator and the first electrode together form a first capacitor, wherein the first electrode corresponds to a first terminal of the first capacitor and the first voltage generator corresponds to a second terminal of the first capacitor;
    a dielectric layer configured to surround the first voltage generator to isolate the first voltage generator from the first electrode;
    a first voltage regulator circuit coupled to the first voltage generator to receive the first induced voltage and configured to generate a first power supply voltage according to the first induced voltage for a first circuit in the device;
    an enabling circuit disposed in a semiconductor layer and configured to generate a first trigger signal; and
    a first function circuit disposed in the semiconductor layer and configured to operate with a second voltage generated in association with the first induced voltage that is transmitted through a switch in response to the first trigger signal.

2. The device of claim 1, wherein
the switch is coupled between the first voltage generator and the first voltage regulator circuit.

3. The device of claim 2, wherein at least one die comprises:
    a plurality of dies, wherein each one of the plurality of dies further comprises the enabling circuit.

4. The device of claim 1, wherein an absolute value of the first voltage is larger than an absolute value of the first induced voltage that is larger than an absolute value of the first power supply voltage.

5. The device of claim 1, further comprising:
a second voltage generator configured to be charged to have a second induced voltage in response to a second voltage of a second electrode of the chuck,
wherein the first voltage and the second voltage are opposite in polarity,
wherein the first voltage generator overlaps the first electrode in a top view and is separated from the second electrode in the top view, and the second voltage generator overlaps the second electrode in the top view and is separated from the first electrode in the top view.

6. A system, comprising:
a chuck, comprising:
    a first metal structure configured to receive a first supply voltage; and
a wafer disposed above the chuck and comprising:
    a second metal structure disposed in a first semiconductor layer of the wafer, wherein the first and second metal structures are configured to form a first capacitor, the first metal structure corresponds to a first terminal of the first capacitor, and the second metal structure corresponds to a second terminal of the first capacitor,
    wherein the second metal structure is configured to transmit a first voltage in response to the first supply voltage;
    a first enabling circuit disposed in a second semiconductor layer under the first semiconductor layer and configured to generate a first trigger signal;
    a first function circuit disposed in the second semiconductor layer and configured to operate with a second voltage generated associated with the first voltage that is transmitted through a first switch in response to the first trigger signal; and
    a first voltage regulator circuit disposed in the second semiconductor layer and configured to receive the first voltage transmitted through the first switch and generate the second voltage in response to the first voltage.

7. The system of claim 6,
wherein the second voltage is equal to the first voltage when the first voltage is smaller than a threshold,
wherein the second voltage is equal to a fix voltage when the first voltage is larger than the threshold.

8. The system of claim 6, wherein the wafer further comprises:
a second enabling circuit disposed in the second semiconductor layer and configured to generate a second trigger signal;
a second voltage regulator circuit disposed in the second semiconductor layer and configured to receive the first voltage transmitted through a second switch in response to the second trigger signal and to generated a third voltage in response to the first voltage; and
a second function circuit disposed in the second semiconductor layer and configured to operate with the third voltage.

9. The system of claim 6, wherein the chuck further comprises:
a third metal structure configured to receive a second supply voltage of a polarity opposite to that of the first supply voltage,
wherein the wafer further comprising:
    a fourth metal structure disposed in the first semiconductor layer, wherein the third and fourth metal structures are configured to form a second capacitor, the third metal structure corresponding to a first terminal of the second capacitor and the second metal structure corresponding to a second terminal of the second capacitor,
wherein the fourth metal structure is configured to transmit a third voltage in response to the second supply voltage.

10. The system of claim 6, wherein the first voltage and the first supply voltage are opposite in polarity.

11. The system of claim 6, wherein the second metal structure is an input/output pad of the wafer.

12. The system of claim 6, wherein the first function circuit is configured to sense at least one parameter of the wafer during a manufacturing process to the wafer in a chamber.

13. The system of claim 12, wherein the first function circuit is configured to generate a sensed value of the parameter and to transmit the sensed value to a memory unit of the wafer to store the sensed value.

14. A device in a chamber, comprising:
at least one die comprising:
a first voltage generator configured to be charged to have a first induced voltage by induced charges generated in response to a first voltage of a first electrode of a chuck in the chamber,
wherein the first voltage generator and the first electrode together form a first capacitor, wherein the first electrode corresponds to a first terminal of the first capacitor and the first voltage generator corresponds to a second terminal of the first capacitor;
a dielectric layer configured to surround the first voltage generator to isolate the first voltage generator from the first electrode;

a first voltage regulator circuit coupled to the first voltage generator to receive the first induced voltage and configured to generate a first power supply voltage according to the first induced voltage for a first circuit in the device;
a first enabling circuit disposed in a semiconductor layer and configured to generate a first trigger signal; and
a first function circuit configured to operate with a second voltage generated in association with the first voltage that is transmitted through a first switch in response to the first trigger signal.

15. The device of claim 14, wherein the first voltage and the first power supply voltage are opposite in polarity.

16. The device of claim 14, wherein the first voltage generator comprises an input/output pad of the at least one die.

17. The device of claim 14, wherein the first function circuit is configured to sense at least one parameter of a wafer of the at least one die during a manufacturing process to the wafer in the chamber.

18. The device of claim 1, wherein the first voltage and the first power supply voltage are opposite in polarity.

19. The device of claim 1, wherein the first voltage generator comprises an input/output pad of the at least one die.

20. The device of claim 1, wherein the first function circuit is configured to sense at least one parameter of a wafer of the at least one die during a manufacturing process to the wafer in the chamber.

* * * * *